US007583565B2

(12) United States Patent
Ogasawara et al.

(10) Patent No.: US 7,583,565 B2
(45) Date of Patent: Sep. 1, 2009

(54) ELECTRONIC TIMEPIECE

(75) Inventors: Kenji Ogasawara, Chiba (JP); Yoshihiro Shibuya, Chiba (JP)

(73) Assignee: Seiko Instruments, Inc. (JP)

( * ) Notice: Subject to any disclaimer, the term of this patent is extended or adjusted under 35 U.S.C. 154(b) by 0 days.

(21) Appl. No.: 11/703,014

(22) Filed: Feb. 6, 2007

(65) Prior Publication Data

US 2007/0189125 A1 Aug. 16, 2007

(30) Foreign Application Priority Data

Feb. 16, 2006 (JP) ............................ 2006-039478

(51) Int. Cl.
*G06F 1/04* (2006.01)
*H03B 5/32* (2006.01)

(52) U.S. Cl. ...................................... 368/159; 331/158

(58) Field of Classification Search ......... 368/157–159; 331/158
See application file for complete search history.

(56) References Cited

U.S. PATENT DOCUMENTS 5,050,138 A * 9/1991 Yamada et al. ................ 368/10
5,844,448 A * 12/1998 Jackoski et al. ............. 331/158
6,097,257 A 8/2000 Kadowaki et al. ........... 331/116
6,133,801 A * 10/2000 Tanaka ....................... 331/158
6,304,152 B1 * 10/2001 Takahashi et al. ...... 331/116 FE
6,320,473 B1 11/2001 Leuschner .................. 331/116
6,791,424 B2 9/2004 Uchiyama et al. ........... 331/116

FOREIGN PATENT DOCUMENTS

JP 2000 286637 10/2000
JP 2002 271138 9/2002
JP 2004 104631 4/2004

* cited by examiner

*Primary Examiner*—Vit W Miska
*Assistant Examiner*—Sean Kayes
(74) *Attorney, Agent, or Firm*—Adams & Wilks

(57) ABSTRACT

To be able to promote oscillation start characteristic while having a simple constitution and maintaining low power consumption. In starting to oscillate an oscillation circuit, a capacitor for protecting from leakage is shortcircuited by bringing a switch of an oscillation stabilizing circuit 11 into a closed state and a constant voltage circuit starts to oscillate the oscillation circuit by supplying a drive voltage of a power source voltage to the oscillation circuit. After an elapse of a predetermined time period, oscillation is prevented from being stopped by leakage by inserting the capacitor into the oscillation circuit loop by bringing the switch into an open state, and an oscillation operation is continued by supplying a voltage lower than the power source voltage to the oscillation circuit by intermittently driving the constant voltage circuit.

4 Claims, 3 Drawing Sheets

ELECTRONIC TIMEPIECE

BACKGROUND OF THE INVENTION

1. Field of the Invention

The present invention relates to an electronic timepiece for displaying time by carrying out a time counting operation based on an output signal of an oscillation circuit.

2. Description of the Prior Art

In a background art, there is utilized an electronic timepiece for displaying time by carrying out a time counting operation based on an output signal of an oscillation circuit.

According to the electronic timepiece of the background art, in normal operation, the oscillation circuit is operated by a predetermined constant voltage supplied from a constant voltage circuit for carrying out a sampling operation in order to achieve low power consumption formation. Further, as a countermeasure against a case in which a terminal of a crystal oscillator constituting the oscillation circuit is leaked by stain or the like of a substrate pattern, a direct current cutting capacitor for protecting from leakage is inserted into an oscillation circuit loop to stabilize an oscillation characteristic.

However, an oscillation start characteristic of the oscillation circuit is deteriorated by the low power consumption formation, and further, a noise constituting a trigger of oscillation is difficult to be inputted by the capacitor and, therefore, a problem arises that the oscillation tart characteristic is further deteriorated.

In order to promote the oscillation start characteristic, there are proposed inventions for promoting the oscillation start characteristic of the oscillation circuit by separately providing an inverter for oscillation having a high drive function (refer to JP-A-10-206568) and providing an auxiliary amplifier portion having a high amplification factor (refer to JP-A-2002-280834).

However, since the inverter for oscillation having the high drive function or the auxiliary amplifier portion having the high amplification factor is separately provided, there poses a problem that power consumption is increased, or the constitution becomes complicated.

It is an object of the invention to be able to promote an oscillation start characteristic while having a simple constitution and maintaining low power consumption.

SUMMARY OF THE INVENTION

According to the invention, there is provided an electronic timepiece characterized in an electronic timepiece comprising oscillating means having a capacitor for protecting from a leakage at inside of an oscillation circuit loop for outputting a signal of a predetermined frequency, dividing means for outputting a timepiece signal constituting a reference of a time counting operation by dividing an output signal of the oscillating means, driving means for outputting a drive signal based on the timepiece signal outputted from the dividing means, displaying means for displaying current time by being driven by the driving means, drive power supplying means for supplying a drive power at least to the oscillating means, and controlling means for controlling the drive voltage outputted from the drive power supplying means, wherein the oscillating means includes switching means, and the controlling means controls the switching means to shortcircuit the capacitor in starting to oscillate the oscillating means and insert the capacitor to inside of the oscillation circuit loop after an elapse of a predetermined time period.

The controlling means controls the switching means to shortcircuit the capacitor in starting to oscillate the oscillating means and insert the capacitor to inside of the oscillation circuit loop after an elapse of a predetermined time period.

Here, there may be constructed a constitution in which the controlling means controls the drive power supplying means to supply a power source voltage to the oscillating means as the drive voltage in starting to oscillate the oscillating means.

Further, there may be constructed a constitution in which the controlling means supplies a voltage within a predetermined range lower than the power source voltage and a voltage pulsating by a predetermined period from the drive power supplying means to the oscillating means by intermittently controlling to drive the drive power supplying means by the predetermined period after an elapse of a predetermined time period from starting to oscillate the oscillating means.

Further, there may be constructed a constitution in which the controlling means controls the drive power supplying means to supply the power source voltage in starting to oscillate the oscillating means, thereafter, controls the drive power supplying means to supply a constant voltage lower than the power source voltage by a predetermined voltage to the oscillating means during a predetermined time period until intermittently driving the drive power supplying means.

BRIEF DESCRIPTION OF THE SEVERAL VIEWS OF THE DRAWINGS

A preferred form of the present invention is illustrated in the accompanying drawings in which.

DETAILED DESCRIPTION OF THE PREFERRED EMBODIMENTS

Figure 1:
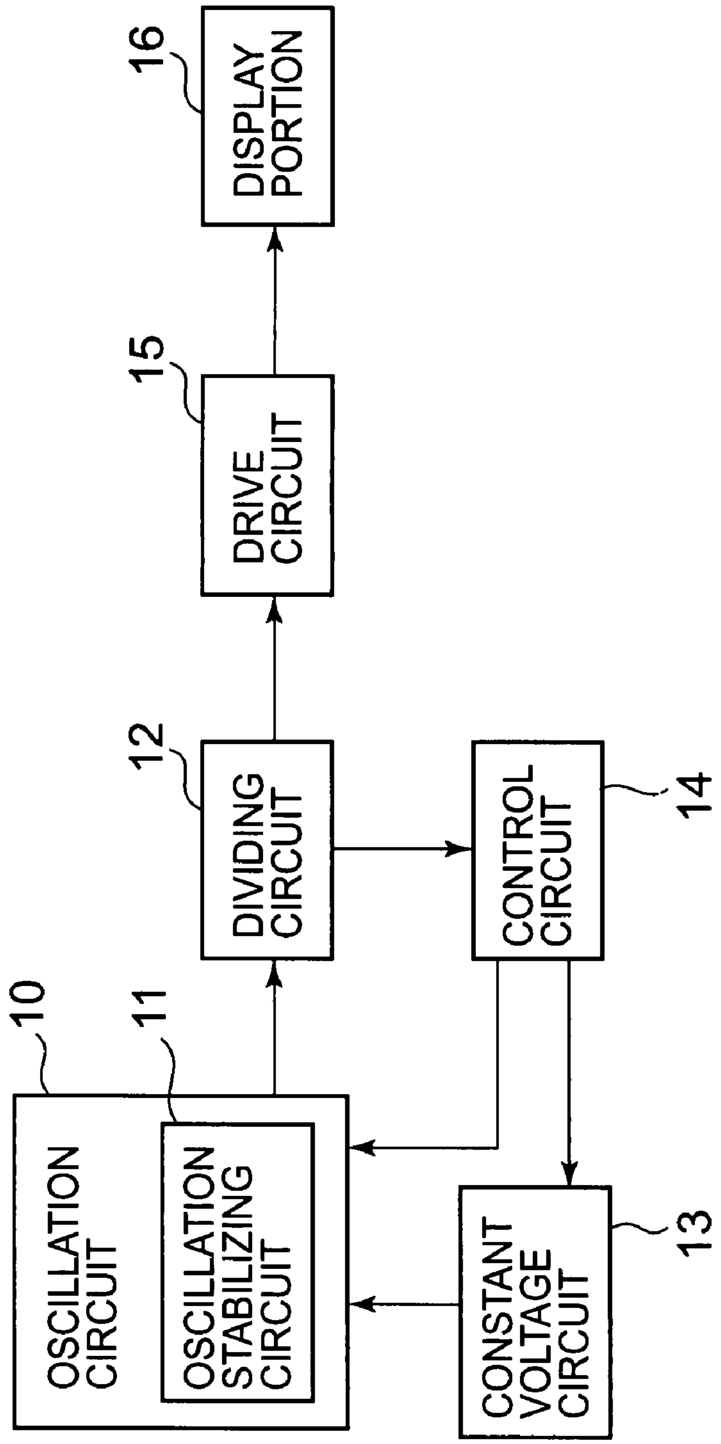
FIG. 1 is a block diagram of an electronic timepiece according to an embodiment of the invention.

FIG. 1 is a block diagram of an electronic timepiece according to an embodiment of the invention.

In FIG. 1, an electronic timepiece includes an oscillation circuit 10 for generating a time base signal having a predetermined frequency, a dividing circuit 12 for generating a timepiece signal constituting a reference of time counting by dividing the time base signal of the oscillation circuit 10, a drive circuit 15 for driving a display portion 16 for displaying time based on the timepiece signal, a control circuit 14 for controlling the oscillation circuit 10 and a constant voltage circuit 13 in synchronism with a signal from the dividing circuit 12, and the display portion 16 for displaying current time or the like by being driven by the drive circuit 15.

The oscillation circuit 10 includes an oscillation stabilizing circuit 11 for continuing an oscillation operation even when current leakage is brought about in the oscillation circuit 10. The oscillation stabilizing circuit 11 includes a capacitor for protecting from current leakage and an opening/closing switch connected in parallel with the capacitor arranged inside of an oscillation circuit loop as described later.

The display portion 16 includes a motor, a train wheel, an indicating hand for displaying time and the like when the electronic timepiece is an analog electronic timepiece, and includes a digital display of a liquid crystal display or the like for displaying time or the like when the electronic timepiece is a digital electronic timepiece.

Figure 2:
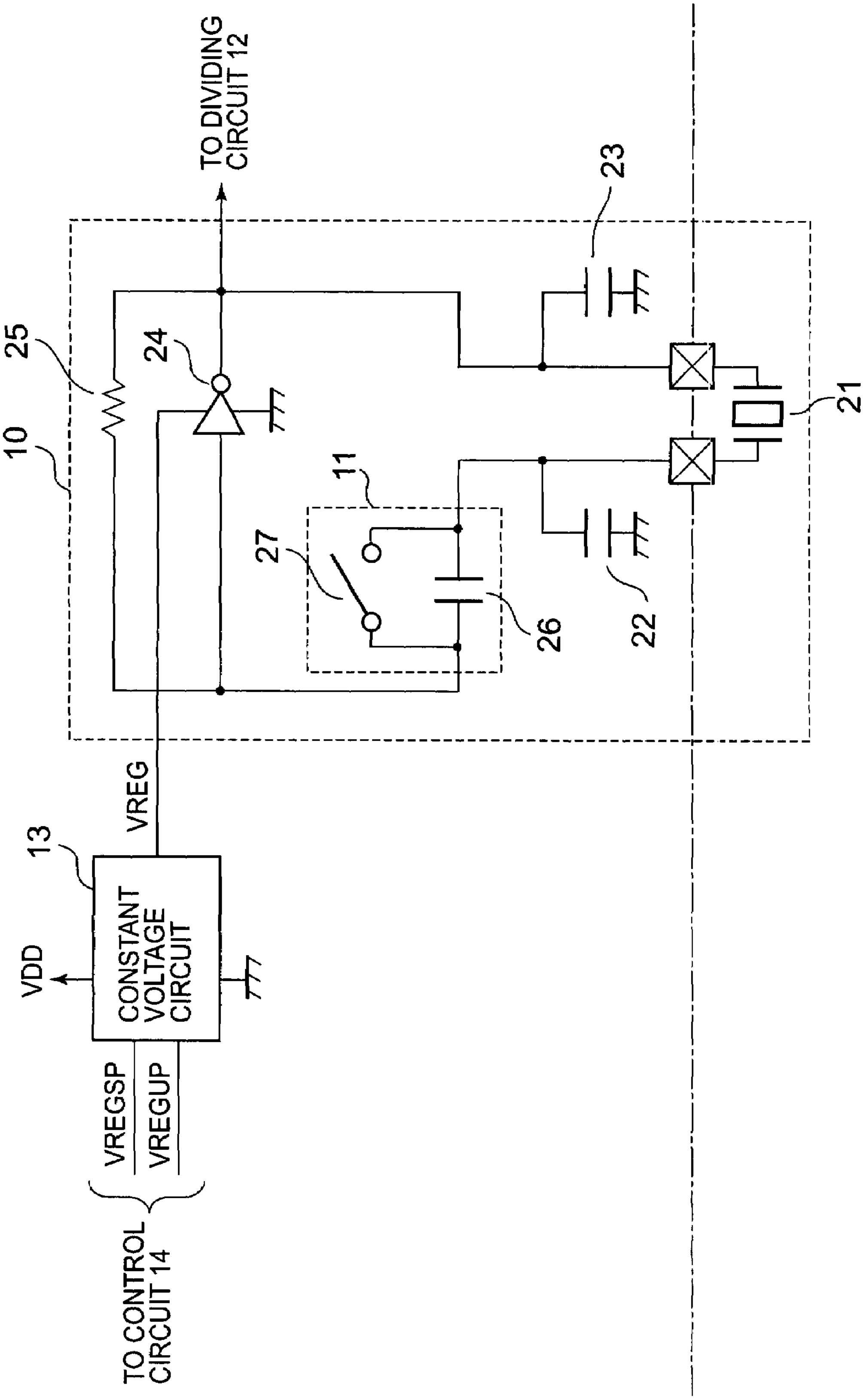
FIG. 2 is a circuit diagram of a portion of the electronic timepiece according to the embodiment of the invention.

Further, although in FIG. 2, it is indicated to supply a drive power only to the oscillation circuit 10 from the constant voltage circuit 13, and drive power supply paths to other constituent elements 12, 14 through 16 are omitted, the drive power may be supplied also to the other constituent elements 12, 14 through 16 from the constant voltage circuit 13, or the drive power may be supplied thereto from another path. That is, the drive power is supplied at least to the oscillation circuit 10 from the constant voltage circuit 13.

FIG. 2 is a circuit diagram showing details of the oscillation circuit 10 shown in FIG. 1 and portions the same as those of FIG. 1 are attached with the same notations.

In FIG. 2, the oscillation circuit 10 includes a crystal oscillator 21, capacitors 22, 23, an inverter 24, a resistor 25 and the oscillation stabilizing circuit 11. The crystal oscillator 21, the capacitors 22, 23, the inverter 24 and the resistor 25 constitute the oscillation circuit loop.

The oscillation stabilizing circuit 11 is a circuit for continuing an oscillation operation even when current leakage is brought about in the oscillation circuit 10, and includes a capacitor 26 for protecting from current leakage and an opening/closing switch 27 connected in parallel with the capacitor 26 inside of the oscillation circuit loop. The opening/closing switch 27 is switchable between open and closed states and is controlled to open and close by an opening/closing control signal COFF supplied from the control circuit 14.

The oscillation circuit 10 is constituted by a semiconductor integrated circuit including also the switch 27 other than the crystal oscillator 21, and the crystal oscillator 21 is outwardly attached to a circuit substrate.

A power source terminal of the constant voltage circuit 13 is connected with a power source voltage VDD constituting an output voltage of a battery for the power source (not illustrated). A control input portion of the constant voltage circuit 13 is inputted with an output voltage control signal VREGUP and is inputted with an output timing control signal VREGSP. The constant voltage circuit 13 supplies a drive voltage VREG in accordance with the control signals VREGUP, VREGSP from the control circuit 14 to the oscillation circuit 10.

Further, the oscillation circuit 10 constitutes oscillating means, the dividing circuit 12 constitutes dividing means, the constant voltage circuit 13 constitutes drive power supplying means, the control circuit 14 constitutes controlling means, the drive circuit 15 constitutes driving means, the display portion 16 constitutes displaying means, and the switch 27 constitutes switching means.

Figure 3:
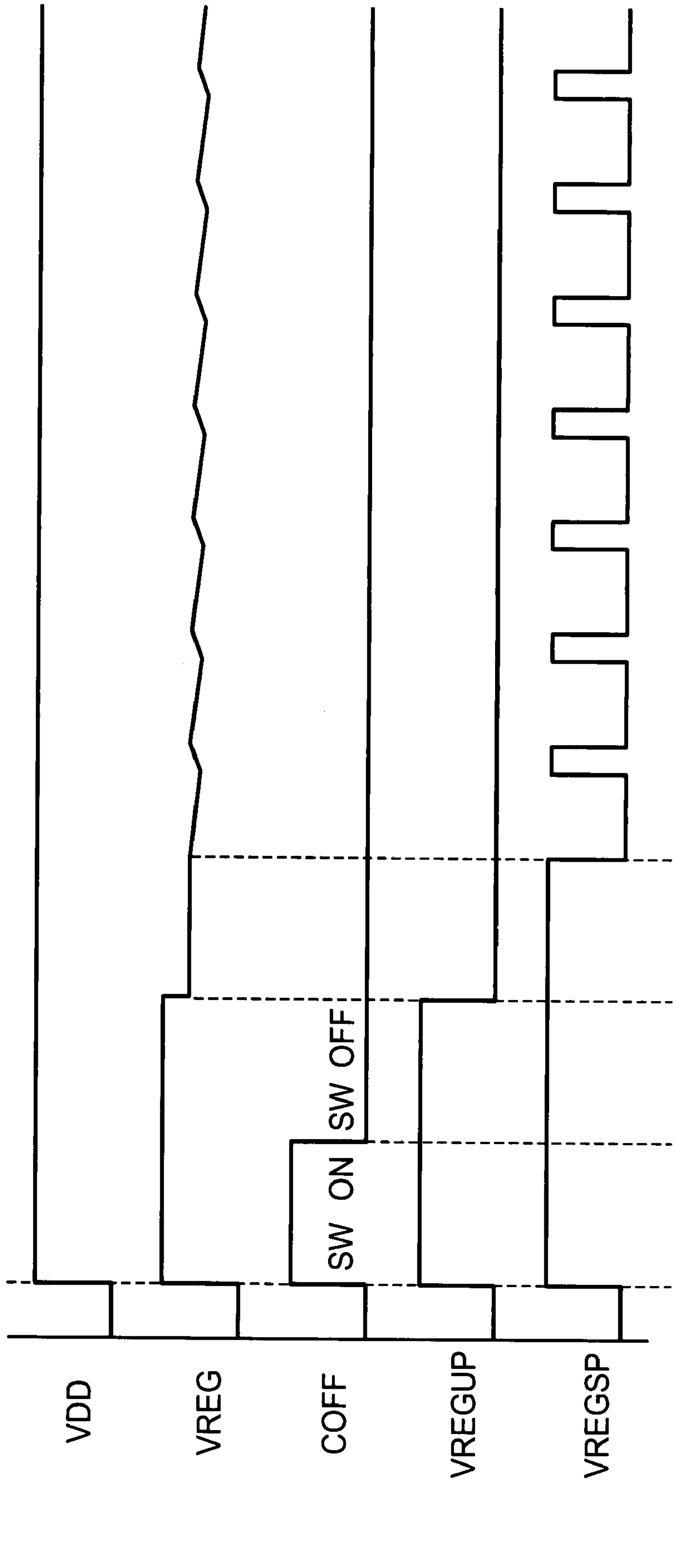
FIG. 3 is a timing chart of the electronic timepiece according to the embodiment of the invention.

FIG. 3 is a timing chart of the electronic timepiece according to the embodiment of the invention, portions the same as those of FIG. 2 are attached with the same notations.

The operation of the electronic timepiece according to the embodiment will be explained in details in reference to FIG. 1 through FIG. 3 as follows.

In FIG. 1, at time T0, when the power source of the electronic timepiece is inputted, the control circuit 14 outputs the opening/closing control signal COFF to the oscillation stabilizing circuit 11 to bring the switch 27 into a closed (ON) state. Thereby, the capacitor 26 is shortcircuited by the switch 27 in the closed state.

Simultaneously therewith, the control circuit 14 outputs the output voltage control signal VREGUP at high level and the output timing control signal VREGSP at high level to the constant voltage circuit 13.

The constant voltage circuit 13 continuously supplies an output voltage of a voltage of the power source voltage VDD in response to the output voltage control signal VREGUP at high level and the voltage in response to the output timing control signal VREGSP at high level to the oscillation circuit 10 as a drive voltage.

The oscillation circuit 10 is continuously supplied with the drive voltage of the power source voltage VDD from the constant voltage circuit 13 and therefore, the oscillation circuit 10 easily starts the oscillation operation. Further, since the capacitor 26 is shortcircuited by the switch 27, the oscillation operation is triggered by noise in starting and the oscillation operation can easily be started.

Next, at time T1 after an elapse of a predetermined time period from time T0, the control circuit 14 brings the switch 27 into an open (OFF) state. Thereby, the capacitor 26 for protecting from leakage is inserted into the oscillation circuit loop and therefore, even when leakage is brought about, the oscillation operation is continuously carried out without being hampered by the capacitor 26.

Next, at time T2 after an elapse of a predetermined time period from time T1, the control circuit 14 brings the output voltage control signal VREGUP to low level. The constant voltage circuit 13 supplies a drive voltage of a predetermined constant voltage lower than the power source voltage VDD by a predetermined voltage to the oscillation circuit 10 as the output voltage in response to the output voltage control signal VREGUP at low level. Thereby, the oscillation circuit 10 is driven by low power consumption.

Next, at time T3 after an elapse of a predetermined time period from time T2, the control circuit 14 constitutes the output timing control signal VREGSP by a pulse signal having a predetermined period and a predetermined duty cycle. The constant voltage circuit 13 is driven intermittently in response to the output timing control signal VREGSP, and a terminal voltage of a capacitor (not illustrated) charged by the constant voltage during a high level time period of the pulse signal and discharged during a low level time period of the pulse signal is supplied to the oscillation circuit 10 as the drive voltage.

That is, the constant voltage circuit 13 supplies the drive voltage of a voltage pulsating between the constant voltage and the voltage lower than the constant voltage by the predetermined voltage by a period the same as that of the pulse signal to the oscillation circuit 10. Thereby, the oscillation circuit 10 can be driven by lower power consumption.

The dividing circuit 12 divides a signal generated by the oscillation circuit 10 as described above to generate a timepiece signal constituting a reference of time counting. The drive circuit 15 drives the display portion 16 based on the timepiece signal. The display portion 16 displays current time or the like by being driven by the drive circuit 15.

As described above, the electronic timepiece according to the embodiment shortcircuits the capacitor 26 for protecting from current leakage by bringing the switch 27 of the oscillation stabilizing circuit 11 into the closed state at the time of starting oscillation. Further, the constant voltage circuit 13 starts to oscillate the oscillation circuit 10 by supplying the drive voltage of the power source voltage VDD. Thereby, the oscillation circuit 10 is easily started to oscillate. Further, after an elapse of a predetermined time period from starting oscillation, the continuous constant voltage lower than the power source voltage VDD is supplied as the drive voltage supplied to the oscillation circuit 10. Thereby, the oscillation circuit 10 continues the oscillation operation stably. Further, after an elapse of a predetermined time period, the capacitor 26 is inserted (switched) into the oscillation circuit loop by bringing the switch 27 into the open state and oscillation is prevented from being stopped by current leakage, and by intermittently driving the constant voltage circuit 13, the voltage lower than the constant voltage and varying in a predetermined voltage range by the intermittent drive period is supplied to the oscillation circuit 10 to continue the oscillation operation.

Therefore, since the capacitor 26 is constituted to shortcircuit in starting oscillation and therefore, the oscillation is easily started, and since the capacitor 26 is inserted into the oscillation circuit loop after starting oscillation, the oscillation operation can be restrained from being stopped by leakage.

Further, in starting oscillation, the oscillation circuit is driven by the high voltage and therefore, the oscillation is easily carried out, and after carrying out the oscillation, the oscillation circuit is driven by a low voltage or driven intermittently and therefore, power saving formation can be achieved.

Further, it is not necessary to separately provide an inverter for oscillation having a high drive function and an auxiliary amplifying portion having a high amplification factor and therefore, low power consumption can be constituted and the constitution can be simplified.

According to the electronic timepiece of the invention, oscillation start characteristic can be promoted while having a simple constitution and maintaining low power consumption.

Further, the electronic timepiece of the invention is applicable to various electronic timepieces of an electronic wristwatch, an electronic clock, an electronic timepiece having a calendar function and the like, and is particularly suitable for an electronic timepiece constituting a power source by a battery.

What is claimed is:

1. An electronic timepiece comprising:

oscillating means having a capacitor for protecting from a current leakage in an oscillation circuit loop for outputting a signal of a predetermined frequency;

dividing means for dividing the output signal from the oscillating means and outputting a timepiece signal constituting a reference of a time counting operation;

driving means for outputting a drive signal based on the timepiece signal outputted from the dividing means;

displaying means driven by the drive signal for displaying current time;

drive power supplying means for supplying a drive power at least to the oscillating means; and controlling means for controlling the drive voltage outputted from the drive power supplying means;

wherein the oscillating means includes switching means; and wherein the controlling means controls the switching means to short-circuit the capacitor in order to generate noise constituting a trigger in starting to oscillate the oscillating means and electrically insert the capacitor into the oscillation circuit loop after an elapse of a predetermined time period, and the controlling means controls the drive power supplying means to supply a power source voltage to the oscillating means as the drive voltage in starting to oscillate the oscillating means, and to supply a voltage within a predetermined range lower than the power source voltage and a voltage pulsating by a predetermined period from the drive power supplying means to the oscillating means by intermittently controlling to drive the drive power supplying means by the predetermined period after an elapse of a predetermined time period from starting to oscillate the oscillating means.

2. The electronic timepiece according to claim 1; wherein the controlling means controls the drive power supplying means to supply the power source voltage in starting to oscillate the oscillating means, thereafter, controls the drive power supplying means to supply a constant voltage lower than the power source voltage by a predetermined voltage to the oscillating means during a predetermined time period until intermittently driving the drive power supplying means.

3. In an electronic timepiece having a display portion that is driven by a frequency-divided time base signal to display current time: an oscillation circuit having an oscillation circuit loop that has two capacitors connected, respectively, to opposite sides of a crystal oscillator and that oscillates to generate the time base signal; an oscillation stabilizing circuit that stabilizes the oscillation of the oscillation circuit, the oscillation stabilizing circuit comprising a third capacitor for protecting against current leakage in the oscillation circuit loop, and a switch switchable to a closed state to short-circuit the third capacitor and switchable to an open state to connect the third capacitor in the oscillation circuit loop; a control circuit that switches the switch to its closed state at the start of oscillation of the oscillation circuit loop and after elapse of a predetermined time switches the switch to its open state; and a constant voltage circuit, controlled by the control circuit, that supplies a power source voltage to the oscillation circuit at the start of oscillation; wherein the control circuit controls the constant voltage circuit to supply a voltage within a predetermined range lower than the power source voltage and a voltage pulsating by a predetermined period to the oscillation circuit by intermittently driving the constant voltage circuit after elapse of a predetermined time period from the start of oscillation.

4. An electronic timepiece according to claim 3; wherein the control circuit controls the constant voltage circuit to supply the power source voltage to the oscillation circuit at the start of oscillation and thereafter controls the constant voltage circuit to supply a constant voltage lower than the power source voltage to the oscillation circuit until intermittently driving the constant voltage circuit.

* * * * *